United States Patent [19]

Jun

[11] Patent Number: 5,612,572
[45] Date of Patent: Mar. 18, 1997

[54] SEMICONDUCTOR DEVICE WITH AN INSULATION GROOVE

[75] Inventor: Young K. Jun, Seoul, Rep. of Korea

[73] Assignee: LG Semicon Co., Ltd., Chungcheongbuk-do, Rep. of Korea

[21] Appl. No.: 472,006

[22] Filed: Jun. 6, 1995

Related U.S. Application Data

[62] Division of Ser. No. 445,164, May 19, 1995, abandoned, which is a continuation of Ser. No. 173,982, Dec. 28, 1993, abandoned.

[51] Int. Cl.⁶ .................... H01L 23/522; H01L 23/532
[52] U.S. Cl. .................... 257/758; 257/759; 257/760
[58] Field of Search .................... 257/759, 760, 257/773, 774, 775, 520, 341, 758

[56] References Cited

U.S. PATENT DOCUMENTS

| | | | |
|---|---|---|---|
| 4,176,016 | 11/1979 | Koel et al. | 204/38 R |
| 4,807,016 | 2/1989 | Douglas | 156/643 |
| 4,949,162 | 8/1990 | Tamaki et al. | 257/758 |
| 4,985,740 | 1/1991 | Shenai et la. | 257/341 |
| 5,041,397 | 8/1991 | Kim et al. | 437/240 |
| 5,164,340 | 11/1992 | Chen et al. | 437/236 |
| 5,166,088 | 11/1992 | Ueda et al. | 437/47 |
| 5,203,957 | 4/1993 | Yoo et al. | 156/643 |
| 5,319,246 | 6/1994 | Nagamine et al. | 257/760 |
| 5,332,924 | 7/1994 | Kobayashi | 257/774 |

FOREIGN PATENT DOCUMENTS

| | | | |
|---|---|---|---|
| 0161648 | 7/1988 | Japan | 257/760 |
| 0082653 | 3/1989 | Japan | 257/760 |
| 0001917 | 1/1990 | Japan | 257/775 |
| 0178951 | 7/1990 | Japan | 257/775 |

OTHER PUBLICATIONS

"New Method of Making Al Single Crystal Interconnections on Amorphous Insulators"; J. Wada, K. Suguro, N. Hayasaka and H. Okano, 31st Annunal Proceedings of Reliability Physics 1993, Atlanta, Georgia, Mar. 23–25, 1993, pp. 71–76.

*Primary Examiner*—Peter Toby Brown
*Attorney, Agent, or Firm*—Morgan, Lewis and Bockius LLP

[57] ABSTRACT

A semiconductor device comprising a semiconductor substrate, an insulation structure formed on the substrate and including a groove extending along a top surface of the insulation structure, and a wiring film formed lengthwise on the groove of the insulation film.

9 Claims, 4 Drawing Sheets

SEMICONDUCTOR DEVICE WITH AN INSULATION GROOVE

CROSS-REFERENCE TO RELATED APPLICATION

This is a divisional of application Ser. No. 08/445,164, filed May 19, 1995, now abandoned, which is a continuation of application Ser. No. 08/173,982, filed Dec. 28, 1993, now abandoned.

FIELD OF THE INVENTION

This invention relates to a semiconductor device and a method of fabricating the same, and more particularly to a semiconductor device technique which is useful for reducing a wiring resistance and improving the reliability of the semiconductor device.

BACKGROUND OF THE INVENTION

Recently, the wiring width and thickness of the semiconductor device have been decreased according to the increase of the density of integration in the semiconductor device. Here, a problem is encountered that the reliability of the wiring is decreased by the failure of the wiring made of aluminum due to electromigration or stress migration.

To improve the reliability of aluminum, a technique has been proposed which makes the size of grains of the grains of aluminum larger and improves the direction of the aluminum crystal so as to tolerate the electromigration and stress migration (Junichi Wada, et al., "New Method of Making Al single crystal interconnections on amorphous insulator", published in International Reliability Physics Symposium(IRPS)).

In this method the Al single crystal is used to form the wiring to tolerate the electromigration and stress migration.

FIGS. 1(a) to 1(c) illustrate the prior art fabrication process. As shown in FIG. 1(a), an oxide film 2 having a thickness of 1 μm is formed on a silicon substrate 1 having a (100) direction and grooves 3 are formed in the oxide film 2 at regular-intervals by using Reactive Ion Etching (RIE) method. Here, the grooves 3 have a depth of 0.4 μm, a width of 0.6 μm and a pitch of 0.6 μm.

Aluminum film 4 having a thickness of 0.4 μm is deposited on the whole surface by using DC (direct current) magnetron sputtering under the normal temperatures as shown in FIG. 1(b).

And, an in-situ heat treatment 5 is performed from bottom of the substrate i by using a halogen lamp heater where the temperature is set at 500 degrees C. and the time at 45 seconds under Ar gas, as shown in FIG. 1(c)(Here, the in-situ heat treatment means that a constant heat treatment is performed, for depositing the aluminum film, in a vacuum in the sputtering chamber which is not broken, so that an oxide film is not formed on the aluminum wiring film.). Thereafter, the aluminum wiring film is patterned to a desired form to complete the wiring process.

As a result of forming the aluminum wiring film in the above processes, the aluminum wiring film filled in the grooves 3 is converted to the single crystal with the same orientation.

Accordingly, the single crystal aluminum having a high tolerance against electromigration and stress migration can improve the reliability of the semiconductor device.

However, in the above technique, stability is degraded when the grooves are formed in the oxide film because the depth of the grooves are controlled by the etching time of the RIE method. Thus, there is a problem that a step coverage of aluminum filled in the grooves is degraded when the aluminum film is deposited by using the sputtering method, so that a uniform single crystal of aluminum can not be obtained on the following process of the heat treatment. Also, there has been a problem in the reproduction due to the development of the slope of temperature around the grooves.

SUMMARY OF THE INVENTION

An object of this invention is to a semiconductor device and a method of producing the same which reduces a wiring resistance and improves the reliability of the semiconductor device.

This and other objects and features of this invention can be achieved by providing a semiconductor device comprising a semiconductor substrate, an insulation film formed on the substrate and including a groove having an inclined plane at upper part, and a wiring film formed on the groove of the insulation film in a length direction of the groove.

Also, a method of fabricating a semiconductor device may be provided comprising the steps of forming an insulation film on a semiconductor substrate, forming a groove having an inclined plane at upper part by etching the insulation film selectively, forming a wiring film on the whole surface, and etching the wiring film selectively to form the wiring.

DETAILED DESCRIPTION OF THE INVENTION

FIG. 2(a) to 2(e) show a wire forming method of a semiconductor arranged in the sequence of processes in accordance with this invention.

Figure 1A:
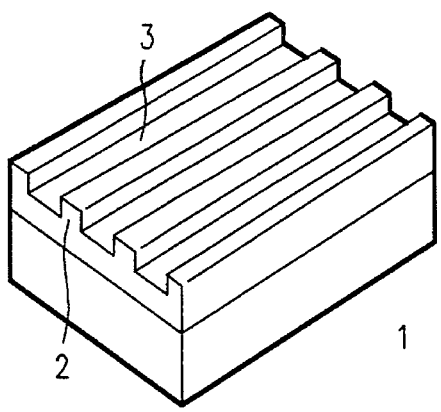
FIGS. 1(a) to 1(c) show conventional process steps of a semiconductor device.
Figure 1B:
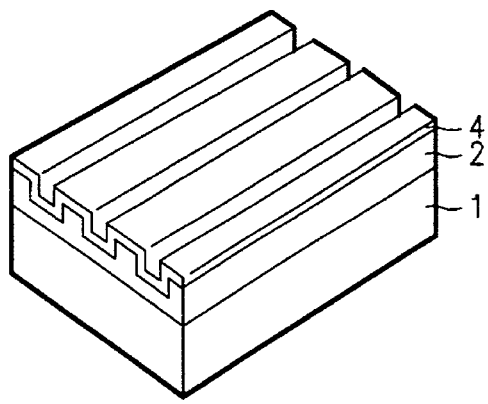
Figure 1C:
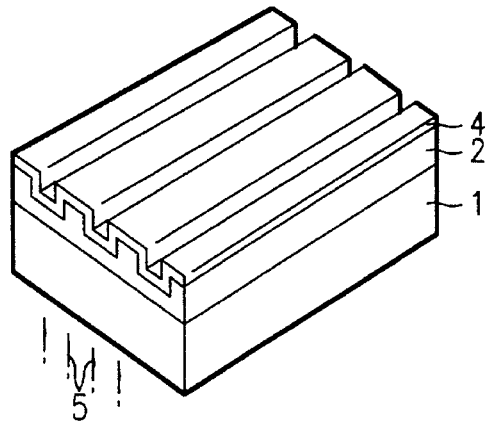
Figure 2A:
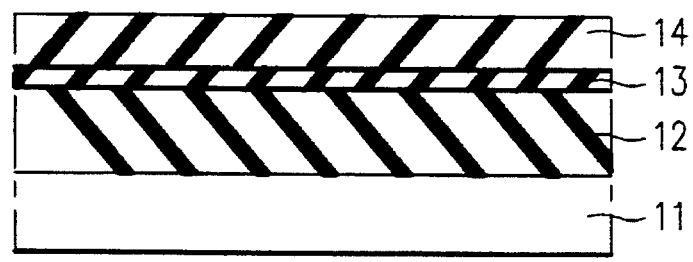
FIGS. 2(a) to 2(e) show process steps in accordance with an embodiment of this invention.

First, as shown in FIG. 2(a), for example an oxide film 12 as an inter-layer insulation film for separation with a wire or a conduction line on a semiconductor substrate 11 on which an element(not shown) has been formed is formed, and form an etch stopper film 13 is formed over the oxide film 12 to a thickness of 1000 to 2000 angstroms. The etch stopper film 13 is for use as an etch stopper in the process of dry etching of a supplementary insulation film to be formed over the etch stopper film in the following process, formed of a material having greater etch selectivity than the supplementary insulation film.

Then, a supplementary insulation film 14 over the etch stopper film 13 is formed to a thickness of 2000 to 5000 angstroms.

As for the supplementary insulation film, a silicon oxide film using $SiH_4$ gas and $O_2$ gas as reaction gases, or a nitride film using $NH_3$ gas and $SiH_4$ gas as reaction gases, as an inorganic insulation film, may be formed by deposition with PECVD (Plasma Enhanced Chemical Vapor Deposition) method, and polyimide or PIQ may be coated with spin coating method as an organic insulation film.

At this time, when the supplementary insulation film is formed of a silicon oxide film, the etch stopper film 13 may be formed of a nitride film or an inorganic insulation film, and when the supplementary insulation film is formed of an organic insulation film, the etch stopper may be formed of an inorganic insulation film.

Figure 2B:
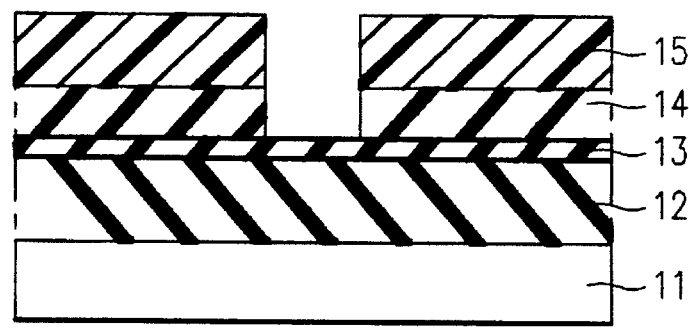

Next, as shown in FIG. 2(b), after coating photo resist 15 over the supplementary insulation film 14, patterning of the photo resist is carried out to a predetermined pattern utilizing general photolithography.

Then, dry etching of the supplementary insulation film utilizing the photo resist pattern as a mask is carried out to form a groove 16 in a wiring region of the supplementary insulation film.

At this time, as an etching process of the supplementary insulation film, dry etching process using gases of $CHF_3$ and $CF_4$ when the supplementary film is of a silicon oxide film is carried out, and using gases having F such as $SF_6$ and $CF_4$ when the supplementary film is of a nitride film, and etching with $O_2$ sputtering or $O_2$ plasma when the supplementary film is of an organic insulation film is carried out when the etching stops at the etch stopper film 13.

Figure 2C:
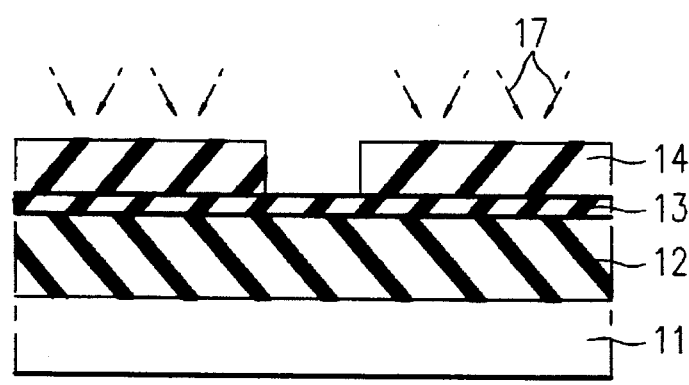

Next, as shown in FIG. 2(c), after removing the photo resist pattern used as the mask, sputter etch 17 is carried out using ions of inert gas of At+etc to round off at the upper edges of the groove formed in the supplementary insulation film 14.

Figure 2D:
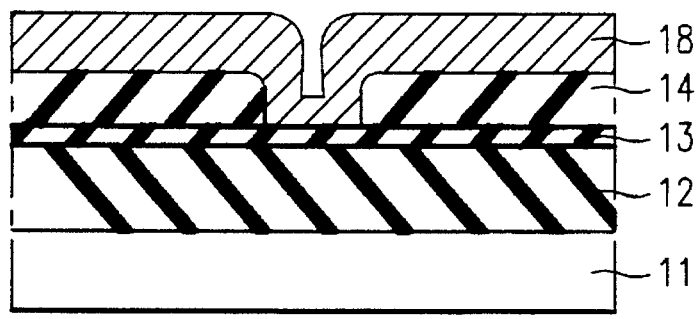

Next, as shown in FIG. 2(d), Al 18 is deposited over the supplementary insulation film 14 such that the groove has been formed therein to a thickness of 4000 to 10000 angstroms with a RF bias or DC bias magnetron sputtering 17 at a pressure of 5 mm Torr using a common Al sputtering method, i.e. using Ar gas as a sputtering gas.

Figure 2E:
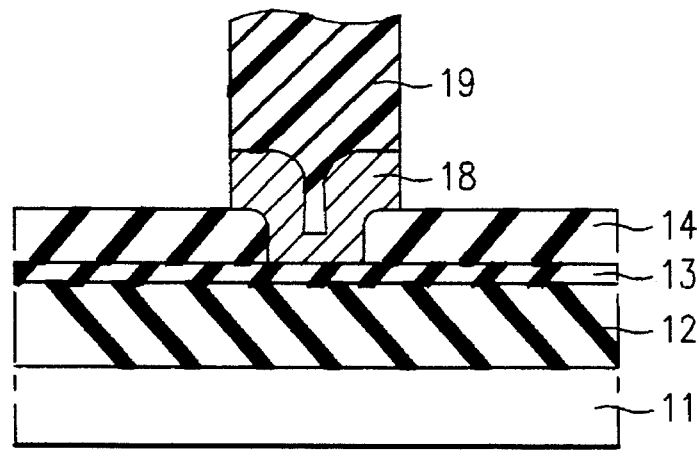

Next, as shown in FIG. 2(e), after coating photo resist 19 over the Al film 18, patterning to a predetermined pattern is carried out using common photo lithography techniques and etching of the Al film 18 utilizing this photo resist pattern 19 as a mask to form a predetermined pattern of Al wiring is carried out.

Figure 3:
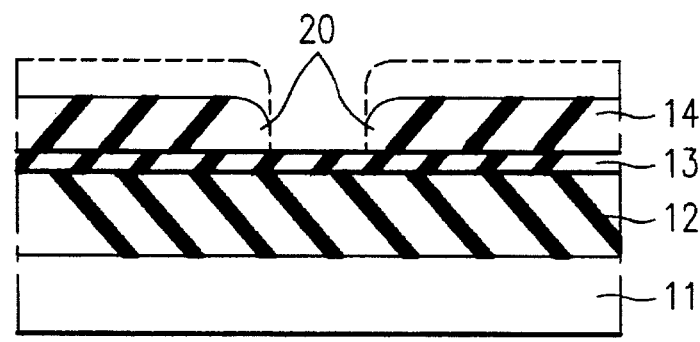
FIG. 3 shows a method of fabricating a semiconductor device in accordance with another embodiment of this invention.

In the meantime, another method for rounding off the upper edges of the groove formed in the supplementary insulation film in accordance with another embodiment of this invention is to be explained hereinafter, referring to FIG. 3.

After forming an inter-layer insulation film 12, an etch stopper film 13, and a supplementary insulation film 14 successively on the semiconductor substrate 11 in the same processes with the processes of the FIGS. 2(a) and 2(b), a groove is formed in a predetermined part, an insulation film is deposited over the resultant and etching back is carried out to form insulation film side walls 20 on both sides of the groove.

By forming insulation film side walls on both sides of the groove formed in a supplementary insulation film as described above, the upper part of the grooves can be wider than the lower part naturally. The processes thereafter are identical with the processes shown in FIGS. 2(d) and 2(e).

Still another method for forming rounds at the upper edges of groove having formed in the supplementary insulation film in accordance with still another embodiment of this invention is to be explained hereinafter, referring to FIG. 4.

After forming an inter-layer film 12, an etch stopper film 13, and a supplementary insulation film 14 successively in accordance with the process shown in FIG. 2(a), a photo resist pattern 15 is formed over the supplementary insulation film 14 as shown in the process in FIG. 2(b).

Figure 4:
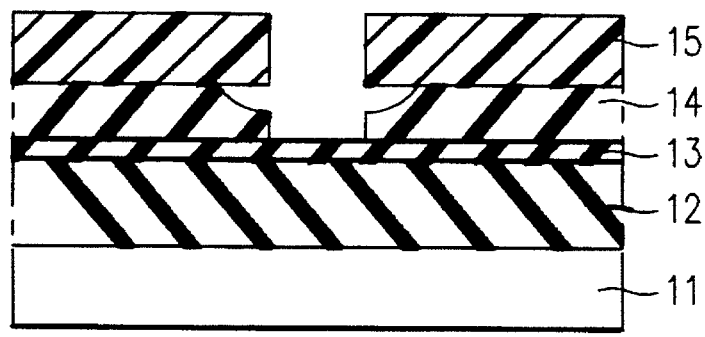
FIG. 4 shows a method of fabricating a semiconductor device in accordance with another embodiment of this invention.

Then, after carrying out a wet etching of the supplementary insulation film 14 utilizing the photo resist pattern 15 as a mask, dry etching is carried out to found off the upper part of the groove having formed in the supplementary insulation film as shown in FIG. 4.

At this time, a water solution containing HF etc. is used as a wet etching solution when the supplementary insulation film is of a silicon oxide film, a water solution containing $H_3PO_4$ etc. is used when the supplementary insulation film is of a nitride film, and the water solution of a strong alkali or acetone is used when the supplementary insulation film is of an organic insulation film.

The features of the wiring formed in accordance with this invention as explained hereinbefore are to be explained hereinafter, referring to FIGS. 5(a) and 5(b).

Figure 5A:
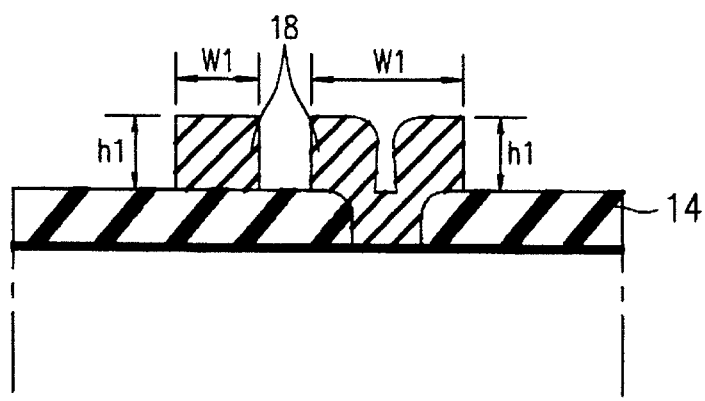
FIGS. 5(a) and 5(b) are sectional views for explaining the characteristics of the semiconductor device in accordance with this invention.

First, as shown in FIG. 5(a), the wire structure in accordance with this invention [wire structure at right in FIG. 5(a)] has the advantage of having a larger actual surface area of a wire than that of the existing wire structure [wire structure at left in FIG. 5(a)] when the height h1 and the width w1 are the same.

Figure 5B:
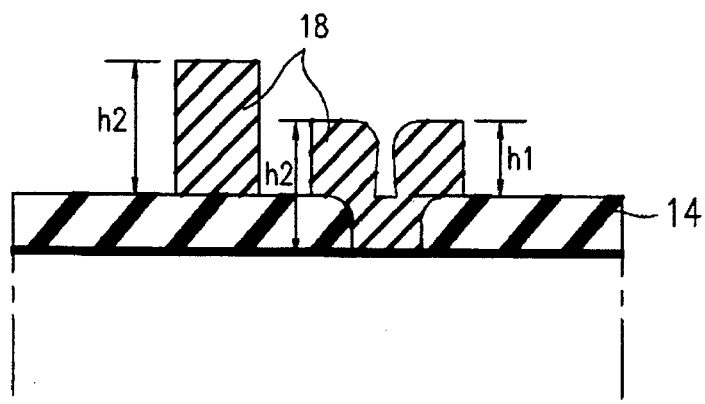

Secondly, as shown in FIG. 5(b), the flattening process of the inter-layer insulation film following these processes become easier because the aspect ratio of the wire is decreased as the height of the wire is h1<<h2 when the actual surface area of wires are the same.

According to this invention as described hereinbefore in detail, the resistance and reliability of a semiconductor can be improved, and the inter-layer flattening process following the wiring process can be carried out easily.

What is claimed is:

1. A semiconductor device with an improved wiring structure comprising:

a semiconductor substrate;

an insulation structure formed on the substrate, the insulation structure comprising an inter-layer insulation film formed on the substrate, an etch stopper formed on the interlayer insulation film, and a supplemental insulation film formed on the etch stopper and including a first groove extending along a top surface of the insulation structure, the first groove having a length which is greater than a width and having an upper portion with rounded corners; and a wiring film formed in the first groove of the insulation structure, and including a second groove extending along a top surface of the wiring film, the second groove having a length which is greater than a width, and the second groove following the length of the first groove.

2. The semiconductor device of claim 1, wherein the etch stopper is 1,000 to 2,000 angstroms thick.

3. The semiconductor device of claim 1, wherein the supplemental insulation film is 2,000 to 5,000 angstroms thick.

4. The semiconductor device of claim 1, wherein the supplemental insulation film comprises a silicon oxide film.

5. The semiconductor device of claim 1, wherein the etch stopper comprises a nitride film.

6. The semiconductor device of claim 1, wherein the etch stopper comprises an inorganic insulation film.

7. The semiconductor device of claim 1, wherein the supplemental insulator comprises an organic insulation film.

8. The semiconductor device of claim 1, wherein the wiring film comprises an aluminum layer with a thickness of 4,000 to 10,000 angstroms.

9. The semiconductor device of claim 1, wherein the first groove includes an upper part that is wider than a lower part.

* * * * *